United States Patent
Geiger et al.

(10) Patent No.: US 6,733,955 B1
(45) Date of Patent: May 11, 2004

(54) METHODS FOR FORMING SELF-PLANARIZED DIELECTRIC LAYER FOR SHALLOW TRENCH ISOLATION

(75) Inventors: Fabrice Geiger, Meylan (FR); Frederic Gaillard, Voiron (FR)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/701,065
(22) PCT Filed: May 10, 1999
(86) PCT No.: PCT/IB99/00835
§ 371 (c)(1), (2), (4) Date: Feb. 12, 2001
(87) PCT Pub. No.: WO99/62108
PCT Pub. Date: Dec. 2, 1999

(30) Foreign Application Priority Data

May 22, 1998 (EP) ............................................. 98401232

(51) Int. Cl.⁷ ................................................. G03F 7/26
(52) U.S. Cl. ....................... 430/313; 430/317; 438/424; 438/700; 438/778; 216/17
(58) Field of Search ................................. 430/311, 313, 430/314, 315, 317, 330; 438/424, 431, 700, 778, 780; 216/17

(56) References Cited

U.S. PATENT DOCUMENTS

| | | | |
|---|---|---|---|
| 5,399,389 A | 3/1995 | Hieber et al. | 427/579 |
| 5,665,635 A | 9/1997 | Kwon et al. | 438/427 |
| 5,786,262 A | 7/1998 | Jang et al. | 438/424 |
| 5,851,927 A * | 12/1998 | Cox et al. | 438/744 |
| 5,930,644 A * | 7/1999 | Tsai | 438/424 |
| 6,030,900 A | 2/2000 | Grassl et al. | 438/700 |
| 6,287,990 B1 * | 9/2001 | Cheung | 438/780 |
| 6,372,606 B1 * | 4/2002 | Oh | 438/435 |

FOREIGN PATENT DOCUMENTS

EP 0 843 348 A2 5/1998

OTHER PUBLICATIONS

Elbel, Norbert, et al., A New STI Process Based on Selective Oxide Deposition; 1998 Symposium on VLSI Technology Digest of Technical Papers, (CAT No. 98CH36216), Honolulu, USA, Jun. 9–11, 1998, pp. 208–209, XP000802805, 1998, New York, NY, USA, IEEE, ISBN: 0–7803–4770–6/98 © 1998 IEEE.

Fischer, E., et al., Global Planarization By Selective Deposition Of Ozone/TEOS, 1995 VMIC Conference, Jun. 27–29, 1995, pp. 247–253, XP002109501.

Lee, Han Sin, et al., An Optimized Densification of the Filled Oxide for Quarter Micron Shallow Trench Isolation (STI), 1996 Symposium On VLSI Technology, Digest Of Technical Papers, Honolulu, USA, Jun. 11–13, 1996, pp. 158–159, XP000639314, Institute Of Electrical And Electronics Engineers, ISBN: 0–7803–3342–X/96 © 1996 IEEE.

Patent Abstracts Of Japan, vol. 015, No. 464 (E–1137), Nov. 25, 1991, and JP 03 198339 A (Maeda Kazuo et al.) Aug. 29, 1991, pp. 211–215.

Search Report for PCT/IB 99/00835, mailed Nov. 26, 1999, 7 pages.

\* cited by examiner

*Primary Examiner*—Kathleen Duda
(74) *Attorney, Agent, or Firm*—Blakely Sokoloff Taylor a & Zafman

(57) ABSTRACT

A method for depositing a trench oxide filling layer (300) on a trenched substrate (224) utilizes the surface sensitivity of dielectric materials such as $O_3$/TEOS. Such materials have different desposition rates on differently constituted surfaces at different levels on the trenched substrate (224) so that the surface profile of the deposited layer (300) is substantially self-planarized. Depositing the dielectric material on a silicon trench (228) produces a high quality filling layer, and cleaning the trench (228) prior to desposition can increase the quality. After desposition, an oxidizing anneal can be performed to grow a thermal oxide (308) at the trench surfaces and densify the dielectric material. A chemical mechanical polish can be used to remove the excess oxide material above an etch stop layer (226) of the substrate (224) which can be formed of LPCVD nitride or CVD antireflective coating.

23 Claims, 14 Drawing Sheets

METHODS FOR FORMING SELF-PLANARIZED DIELECTRIC LAYER FOR SHALLOW TRENCH ISOLATION

BACKGROUND OF THE INVENTION

The present invention relates to the fabrication of integrated circuits. More particularly, the present invention is directed toward a method for providing self-planarized deposition of high quality dielectric layers for shallow trench isolation.

Semiconductor device geometries continue to decrease in size, providing more devices per unit area on a fabricated wafer. These devices are typically initially isolated from each other as they are built into the wafer, and they are subsequently interconnected to create the specific circuit configurations desired. Currently, some devices are fabricated with feature dimensions as small as 0.18 $\mu$m. For example, spacing between devices such as conductive lines or traces on a patterned wafer may be separated by 0.18 $\mu$m leaving recesses or gaps of a comparable size. A nonconductive layer of dielectric material, such as silicon dioxide ($SiO_2$), is typically deposited over the features to fill the aforementioned gaps and insulate the features from other features of the integrated circuit in adjacent layers or from adjacent features in the same layer.

Dielectric layers are used in various applications including shallow trench isolation (STI) dielectric for isolating devices and interlayer dielectric (ILD) formed between metal wiring layers or prior to a metallization process. In some cases, STI is used for isolating devices having feature dimensions as small as under about 0.5 $\mu$m. Planarization of dielectric layers has become increasingly important as the packing densities of semiconductor devices continue to grow.

The planarization issue is described using an example of a typical process for forming a shallow trench isolation (commonly referred as STI integration) as illustrated in FIGS. 1a–1g. In FIG. 1a, a silicon substrate 110 has deposited thereon a pad oxide layer 112 and a nitride layer 114 such as silicon nitride. The nitride layer 114 is typically deposited by low pressure chemical vapor deposition (LPCVD), and serves as an etch stop for chemical mechanical polishing (CMP). Referring to FIG. 1b, a bottom anti-reflective coating (BARC) 116 is formed above the nitride layer 114 for absorbing light reflected from the substrate 110 during photolithography. Typically an organic spin-on glass (SOG), the BARC 116 is needed typically for light having wavelengths of below about 248 nm, including deep ultraviolet (DUV) and far ultraviolet (FUV) light. A photoresist 118 is formed over the BARC 116 and exposed using a mask (not shown) which defines the location of the trenches. The exposed photoresist is then stripped to leave open areas for forming the trenches. Typically, a plasma etch is performed to etch the open areas through the nitride 114, pad oxide 112, and silicon substrate 110 to form the trenches 120, as shown in FIG. 1c. After the remaining photoresist 118 and BARC 116 are removed, a thermal oxide 122 is typically grown on the nitride/pad oxide and on the surfaces of the trenches 120 (trench bottom 124 and trench wall 126) to repair the plasma damage to the silicon substrate 110, as illustrated in FIG. 1d.

A dielectric layer 128 is then deposited over the thermal oxide 122 to fill the trenches 120 and cover the nitride layer 114. This dielectric layer 128 is often referred to as a trench oxide filling layer. Typical dielectric layers are formed from oxide materials such as silicon dioxide or silicate glass. As shown in FIG. 1e, the surface profile of the deposited dielectric layer 128 is stepped and generally resembles the shape of the trended substrate 110. The surface profile is more uniform in dense fields with closely space narrow trenches than in open fields with wide trenches. As seen in FIG. 1e, a step height 130 is formed in the dielectric profile between the dense field 134 and the open field 132. Because of the step height 130, it is not practicable to apply CMP directly after the dielectric layer deposition step to planarize the dielectric layer 128 because otherwise a dishing effect in the open field 132 will result with CMP, as seen in FIG. 1h. Instead, a reverse mask and etch procedure is used to etch the extra oxide to obtain a more planar surface profile as illustrated in FIG. 1f. This procedure typically involves the steps of photoresist deposit, reverse masking, cure, etched photoresist removal, etchback, and removal of remaining photoresist. A CMP procedure is then applied to the structure of FIG. 1f to globally planarize the surface of the filled substrate 110 as shown in FIG. 1g. The reverse mask and etch procedure necessitated by the step height effect adds significant cost and complexity (for example, due to the added lithography steps involved) to the planarization procedure.

From the discussion above, it is seen that multiple steps, including additional photolithography steps (which require expensive equipment), are needed to provide STI. However, it is desirable to reduce the number of steps (and related equipment, especially photolithography equipment which requires expensive lenses, light sources, etc.) and to obtain improved results in order to provide a more economic and efficient manufacturing process. For example, one way to obtain improved results is to provide a self-planarized, high quality trench oxide filling layer at a reduced cost.

A number of procedures are known for depositing dielectric layers such as the gap-fill dielectric 128 for the trench oxide filling layer in the example shown in FIG. 1e. One type of process employs $O_3$ (ozone) and TEOS (tetraethylorthosilicate) for depositing a dielectric film such as silicate glass. Such films deposited are commonly referred to as "$O_3$/TEOS films". $O_3$/TEOS processes have a surface sensitivity which increases as the $O_3$/TEOS ratio increases. Due to the surface sensitivity, the dielectric deposition rate varies in accordance with the properties of the material of the underlying layer.

It is known to minimize the surface sensitivity by depositing a surface insensitive barrier layer prior to the $O_3$/TEOS film deposition. For instance, one known process involves a plasma-enhanced TEOS (PETEOS) deposition, followed by a surface treatment and then a thin cap TEOS layer. This process undesirably requires additional process steps. Another known method is to lower the surface sensitivity by decreasing the $O_3$/TEOS ratio. However, lowering the $O_3$/TEOS ratio tends to undesirably result in a more porous dielectric film. This is particularly problematic when the dielectric film is used for isolation purposes. One way to address this concern has been to raise the process temperature to above about 500° C., but raising the process temperature is often undesirable. Alternatively, an additional anneal process after the deposition of the trench oxide filling layer and sandwiching PETEOS layers has been used to densify the trench oxide filling layer. This method, however, suffers from the need to perform an extra step.

Instead of minimizing the surface sensitivity, some have utilized the deposition rate dependence of $O_3$/TEOS films to perform gap fill for a trenched silicon substrate wherein the side walls of the trench are covered with thermal oxide spacers. Using an atmospheric pressure CVD (APCVD)

$O_3$/TEOS deposition and an ozone concentration of 5%, it was reported that faster film growth on the bottom silicon than on the side wall spacers precluded void formation to achieve void-free gap fill. Others have investigated the feasibility of forming a planarized intermetal dielectric (IMD) by taking advantage of the surface sensitivity of $O_3$/TEOS and similar materials such as $O_3$-octamethylcyclotetrasiloiane (OMTC). Researchers have reported difficulties of controlling the different deposition rates to achieve planarity. For instance, significant elevations have been observed at the edges of aluminum metal lines caused by the different deposition rates of the $O_3$/TEOS on a TiN ARC layer on top of the aluminum and the aluminum side walls. Some of these same researchers have reported more satisfactory planarization results for depositing $SiO_2$ layers on an aluminum interconnect built upon a phosphorus glass (PSG) level using $O_3$-OMTC.

In light of the above, attempts to obtain planarity by depositing surface sensitive dielectric layers have not always been successful. In addition, the inventors have discovered that these methods may produce dielectric layers that do not have the desired quality.

What is needed are more efficient and economic methods for self-planarized deposition of a high quality trench oxide filling layer for shallow trench isolation integration. Improved methods of effectively utilizing the deposition rate dependence of dielectric materials such as $O_3$/TEOS films are also desired.

SUMMARY OF THE INVENTION

Specific embodiments of the present invention provide more efficient methods for providing shallow trench isolation integration by forming self-planarized, high quality trench fill layers using surface sensitive dielectric materials. The invention does so by providing a method of depositing the dielectric material on a silicon trench and then growing a thermal oxide at the trench surfaces by an oxidizing anneal after deposition of the trench fill layer. In this way, defects that are formed using previous methods can be virtually eliminated. An optional trench cleaning step can be used prior to deposition to further improve the quality of the trench fill layers and the electrical characteristics of the device.

One embodiment of the invention is directed to a method for forming a dielectric layer on a silicon substrate which includes a silicon trench formed between upper portions and having a trench bottom and a trench wall. The substrate is disposed in a substrate processing chamber. The method uses a precursor which provides deposition rate dependence of the dielectric layer on differently constituted surfaces at different levels on the substrate. The differently constituted surfaces at different levels include the trench bottom and a material on the upper portions. The method includes the steps of introducing the precursor, preferably TEOS, into the substrate processing chamber and flowing ozone into the substrate processing chamber to react with the precursor to deposit a dielectric layer over the substrate. An ozone/precursor ratio between the ozone and the precursor is adjusted to regulate deposition rates of the dielectric layer on the differently constituted surfaces until the dielectric layer develops a substantially planar dielectric surface.

In accordance with another embodiment, a substrate processing system comprises a housing defining a process chamber. A substrate holder is located within the process chamber for holding a silicon substrate which includes a silicon trench formed between upper portions and having a trench bottom and a trench wall. The system further includes a gas delivery system for introducing process gases into the process chamber and a controller for controlling the gas delivery system. A memory is coupled to the controller comprising a computer-readable medium having a computer-readable program embodied therein for directing operation of the controller. The computer-readable program includes a set of instructions to control the gas delivery system to introduce a process gas including ozone and a precursor into the process chamber to form a dielectric layer on the silicon substrate. The precursor provides deposition rate dependence of the dielectric layer on differently constituted surfaces at different levels comprising the trench bottom and a material on the upper portions of the silicon substrate, and to adjust an ozone/precursor ratio between the ozone and the precursor until the dielectric layer develops a substantially planar dielectric surface.

Another embodiment is directed to a method for processing a substrate including a trench having a trench surface and a trench fill material disposed thereon. The substrate is disposed in a substrate processing chamber. The method includes the steps of providing an oxygen-containing gas in the substrate processing chamber and heating the substrate to substantially simultaneously densify the trench fill material and to form a thermal oxide at the trench surface.

According to another embodiment, a substrate processing system comprises a housing defining a process chamber. A substrate holder is located within the process chamber for holding a substrate including a trench having a trench surface and a trench fill material disposed therein. The system includes a gas delivery system for introducing process gases into the process chamber, a heater for healing the substrate, and a controller for controlling the gas delivery system and the heater. A memory is coupled to the controller comprising a computer-readable medium having a computer-readable program embodied therein for directing operation of the controller. The computer-readable program includes a set of instructions to control the gas delivery system to introduce an oxygen-containing gas into the process chamber and to control the heater to heat the substrate to substantially simultaneously densify the dielectric layer and form a thermal oxide at the trench surface.

According to yet another embodiment, a method for forming a trench isolation structure on a substrate includes the step of applying a CVD anti-reflective coating (CVD ARC) on and contacting the substrate. A photoresist is formed on the CVD anti-reflective coating. A portion of the photoresist is exposed to a light to define a location where a trench is to the formed. The photoresist is removed at the location. The method further includes the step of etching, at the location, through the CVD anti-reflective coating and through a depth of the substrate to form the trench at the location.

For a further understanding of the objects and advantages of the present invention, reference should be made to the ensuing detailed description taken in conjunction with the accompanying drawings.

DETAILED DESCRIPTION OF THE PREFERRED EMBODIMENTS

I. Self-Planarized Deposition of a Dielectric Layer in Shallow Trench Integration Specific embodiments of the present invention are illustrated using an STI integration as an example. The benefits of the various embodiments of the invention can be readily seen by comparison with the prior art methods, such as illustrated in FIGS. 1a–1h. Specifically, the present invention provides more efficient shallow trench isolation integration by providing self-planarized deposition of a dielectric trench fill layer without sacrificing the quality of the dielectric layer. It is understood that the scope of the invention is not necessarily limited to STI integration.

A. Forming a Trench

Figure 2A:
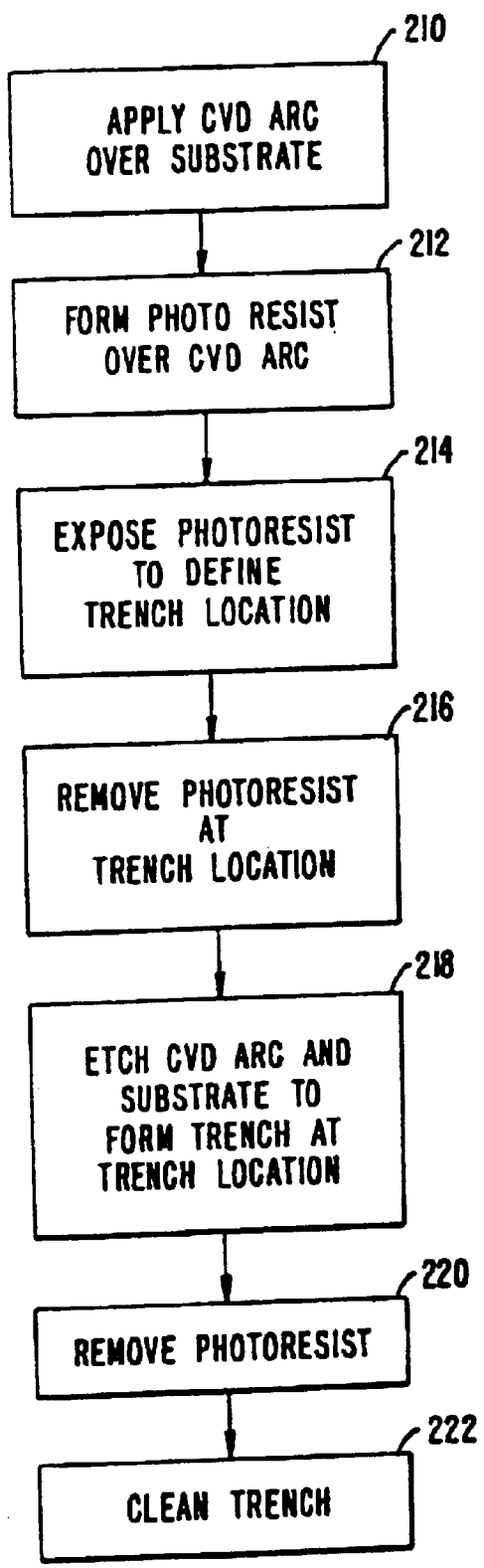
FIGS. 2a and 2b are flow diagrams of alternate embodiments of the method of forming a trench in accordance with the present invention.
Figure 2B:
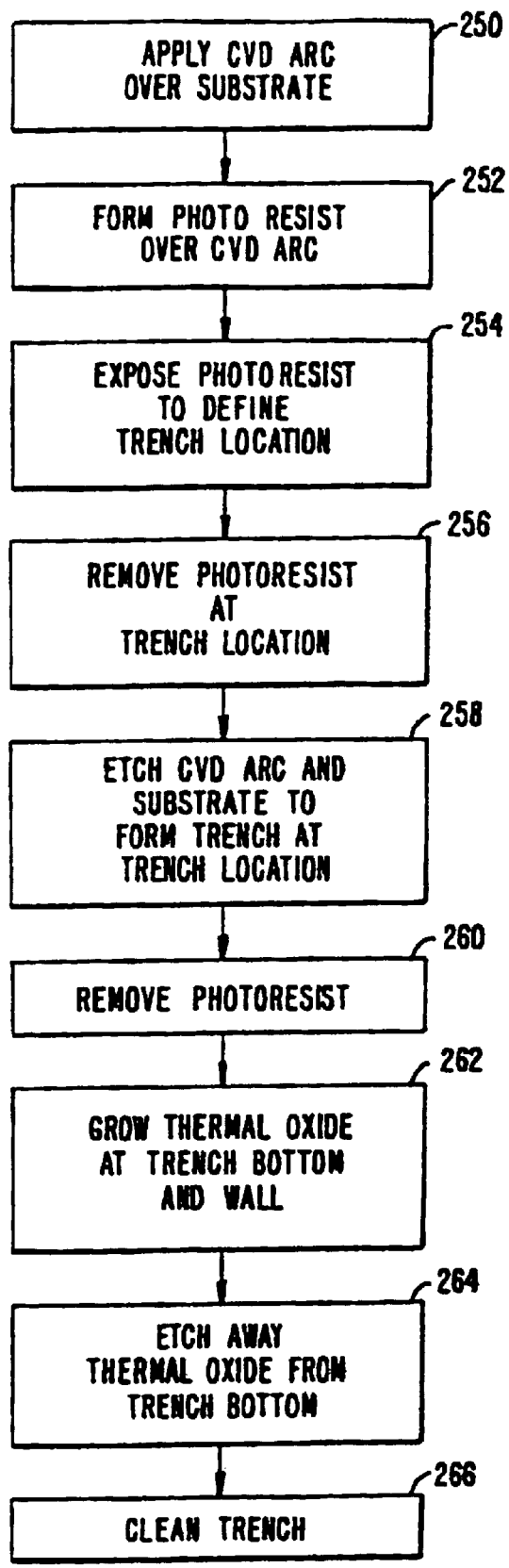

FIGS. 2a and 2b illustrate alternate methods of forming a trench on a substrate which is typically made of silicon. Referring to FIG. 2a, the first step 210 is to apply a CVD anti-reflective coating (CVD ARC) directly on the silicon substrate. Notably, use of CVD ARC eliminates the need for pad oxide and nitride layers typically used for STI integration. Unlike the commonly used organic spin on BARC, CVD ARC is an inorganic material that typically includes, for example, silicon nitride, silicon oxynitride, or silicon carbide. The CVD ARC is deposited by promoting chemical reaction of the process gases in a CVD system. For example, a CVD ARC which includes silicon, and nitrogen and/or oxygen (also known as a dielectric ARC or DARC) is deposited by introducing the following process gases in plasma-enhanced CVD (PECVD): a silicon-containing gas (such as silane or TEOS), and a nitrogen-containing gas and/or an oxygen-containing gas. Nitrous oxide ($N_2O$) may be used for supplying nitrogen and oxygen, but other sources of oxygen and nitrogen can of course be used. An inert gas such as helium or argon is typically used for controlling the deposition rate of the process and the film thickness, and for stabilizing the process. An example of a suitable CVD apparatus is described in U.S. Pat. No. 5,558,717 entitled "CVD PROCESSING CHAMBER," issued to Zhao et al. The gas ratio can be adjusted to obtain a film composition with the desired optical characteristics (refractive index and absorptive index) of the deposited CVD ARC. A CVD ARC silicon nitride layer differs from the conventional LPCVD silicon nitride layer in that the film composition of the LPCVD silicon cannot be modified because LPCVD is a thermal process rather than a plasma-enhanced process. Some of the techniques that can be used to deposit CVD ARC are described in U.S. patent application Ser. No. 08/672,888 entitled "METHOD AND APPARATUS FOR DEPOSITING ANTIREFLECTIVE COATING," having David Cheung, Joe Feng, Judy H. Huang, and Wai-Fan Yau as inventors; U.S. patent application Ser. No. 08/852,787 entitled "METHOD AND APPARATUS FOR DEPOSITING AN ETCH STOP LAYER," having Judy H. Huang, Wai-Fan Yau, David Cheung, and Chan-Lon Yang as inventors; and "Novel ARC Optimization Methodology for KrF Excimer Laser Lithography at Low K1 Factor" by Tohru Ogawa, Mitsunori Kimura, Yoichi Tomo, and Toshiro Tsumori, published in the SPIE Proceedings (Optical/Laser Microlithography V), Volume 1674, pages 362–375 (1992). The two applications are assigned to Applied Materials, Inc., the assignee of the present invention. These references are hereby incorporated by reference.

In one embodiment, a desired ratio of silane ($SiH_4$) to $N_2O$ is selected for depositing a DARC. In addition, $N_2$ and $NH_3$ are introduced to further control the optical and chemical properties of the DARC deposited. The effects of $N_2$ and $NH_3$ are particularly dominant in process regimes where $SiH_4$ and $N_2O$ have minimal or no effect on the DARC properties, e.g., at low temperature. The addition of $NH_3$ and $N_2$ in the process further changes the composition of the film, allowing more freedom and finer tuning of the refractive index and the absorptive index. Furthermore, the process is compatible with the use of helium, which is more cost-effective than argon. Helium also allows for improved stress control of the DARC layer deposited. This helps prevent the film from becoming too tensile, which can cause it to flake off the substrate after deposition.

Figure 1A:
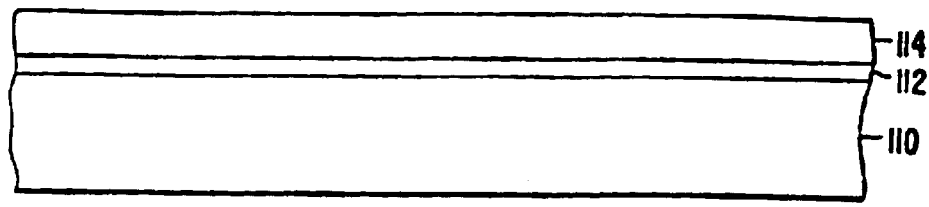
FIGS. 1a–1h are vertical cross-sectional views of a substrate, demonstrating trench formation and trench fill by a dielectric material employing prior art deposition methods.
Figure 1B:
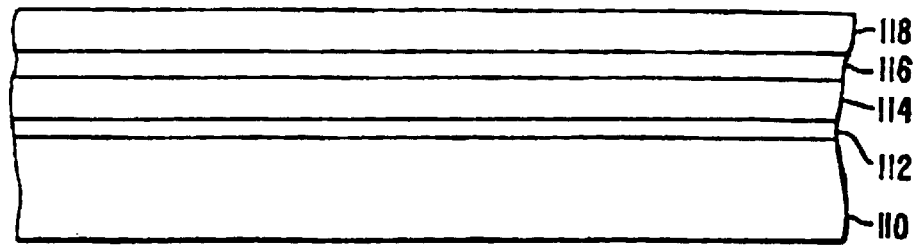
Figure 1C:
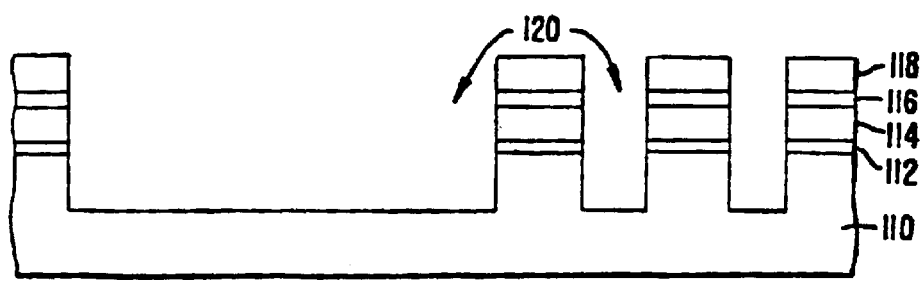
Figure 1D:
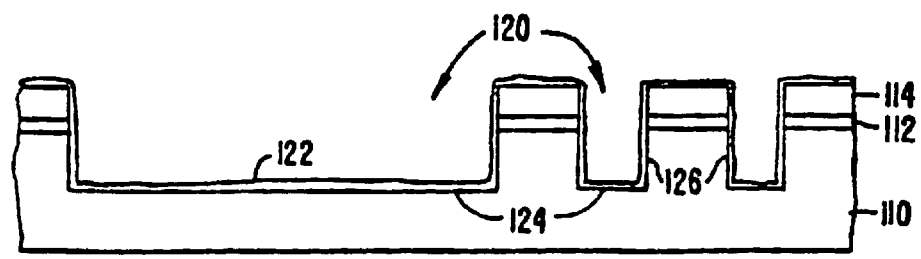
Figure 1E:
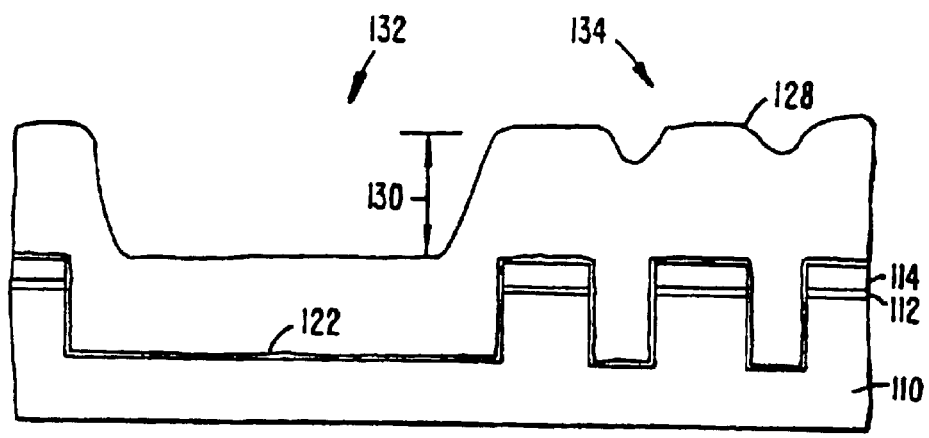
Figure 1F:
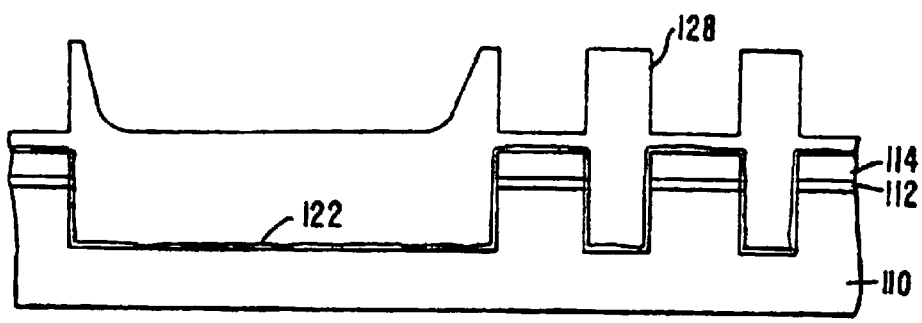
Figure 1G:
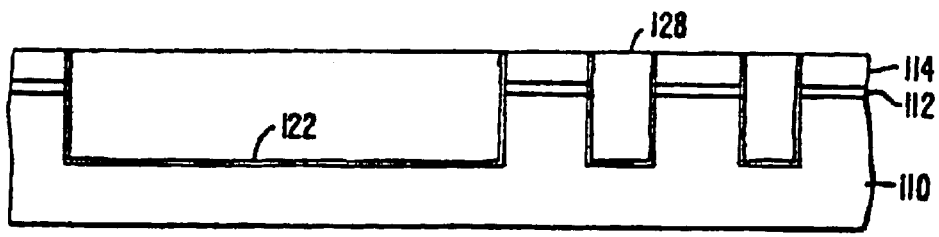
Figure 1H:
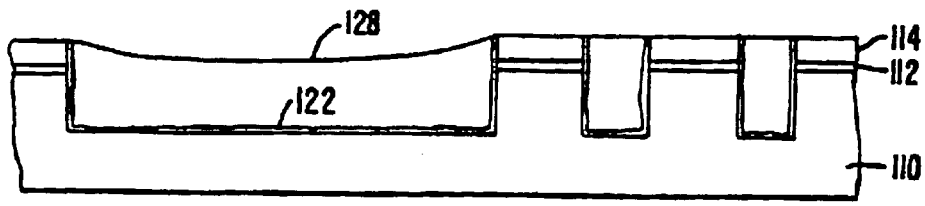

The CVD ARC has the ability to absorb light reflected from the substrate during photolithography similar to the BARC (FIG. 1b). In addition, the CVD ARC has a reflective property that allows it to reflect light that is out-of-phase from light reflected from the substrate so that the two cancel each other in what is referred to as a phase shift cancellation.

The CVD ARC also has the important additional ability to serve as an etch stop for CMP, making it possible to eliminate the LPCVD nitride layer (FIG. 1g), as mentioned above. Further, unlike the LPCVD nitride, the CVD ARC can be applied directly on the silicon substrate. The pad oxide layer (FIG. 1a) is no longer needed to cushion the transition of stresses between the silicon substrate and an LPCVD nitride layer. Therefore, the single CVD ARC layer can replace the pad oxide, LPCVD nitride, and BARC, thereby resulting in a simpler structure and a more efficient method of preparing the substrate for STI. The CVD ARC serves both photolithography and CMP purposes, and also is a good barrier to oxygen diffusion.

Figure 3A:
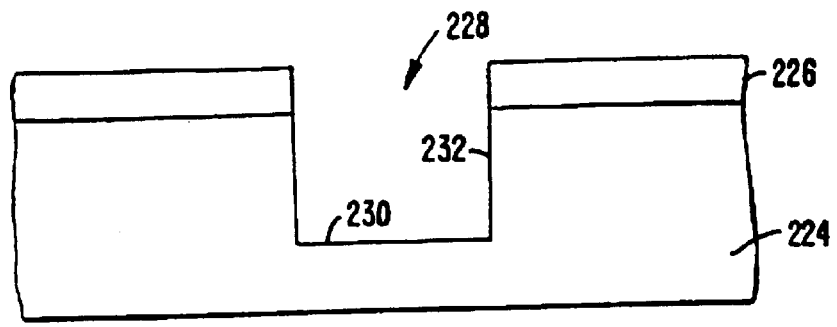
FIGS. 3a and 3b are vertical cross-sectional views of alternate embodiments of a trenched substrate, demonstrating the use of CVD anti-reflective coatings in accordance with the present invention.

Referring again to FIG. 2a, a photoresist is formed over the CVD ARC at step 212. The photoresist is exposed to define the trench location where the trench is to be formed (step 214) and the exposed photoresist is then stripped at the trench location (step 216) according to a specific embodiment. An etching step 218 is performed to etch the CVD ARC and silicon substrate to form the trench at the trench location. At step 220, the remaining photoresist is removed. According to some specific embodiments, an optional clean step 222 can be performed to clean the trench and remove contaminants. The clean step 222 can employ, for example, a conventional wet etching procedure using a mixture containing hydrofluoric acid (HF). The resultant structure is illustrated in FIG. 3a, which shows the silicon substrate 224 with a CVD ARC 226 formed thereon having a thickness of about 1000–2000 Å. The formed trench 228 has a trench bottom 230 and a trench wall 232.

Compared with the conventional approach illustrated in FIGS. 1a–1d, the method of FIG. 2a can eliminate the process of growing a thermal oxide over the surfaces of the trench, which is conventionally used to repair the plasma damage to the silicon substrate during trench formation. The inventors have found that depositing the surface sensitive dielectric material such as $O_3$/TEOS directly over a silicon trench significantly improves the quality of the trench fill layer to be formed over prior approaches and that the clean step 222 can further improve film quality, as discussed in more detail below. In addition, the inventors have discovered that an oxidizing anneal process can be used after formation of the trench fill layer to grow a thermal oxide at the trench bottom and trench wall as discussed below.

The CVD ARC may be used in specific embodiments of the invention. According to some specific embodiments, subsequent process steps described below may be used whether the CVD ARC or the prior BARC/nitride/oxide combination is used. Therefore, after the formation of the trench, the term "etch stop" layer will be used instead and is understood to represent an LPCVD nitride layer (with a pad oxide interface) or CVD ARC.

Figure 3B:
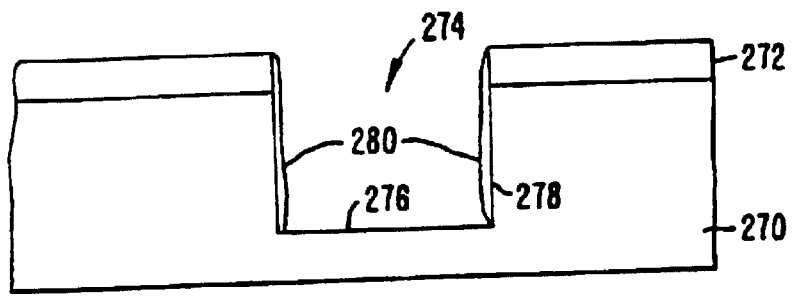

In the alternate embodiment shown in FIG. 2b, steps 250–260 are the same as steps 210–220 of FIG. 2a and are carried out to etch the trench using the photoresist. After the photoresist is removed (step 260), however, two additional process steps are performed. In step 262, a thermal oxide is grown on the trench bottom and trench wall similar to that shown in FIG. 1d. The thermal oxide at the trench bottom is etched away, for example, using a conventional plasma etch procedure (step 264). The resultant structure is illustrated in FIG. 3b, which shows a silicon substrate 270 with an etch stop layer 272 (CVD ARC or LPCVD nitride) formed thereon and a trench 274 with a trench bottom 276 and a trench wall 278. After removal of the thermal oxide at the trench bottom 276, the remaining thermal oxide 280 is shown at the trench wall 278. Thereafter, a clean step 266 is advantageously performed using a conventional wet etching process with an HF mixture or the like to remove contaminants. As discussed below, the inventors have discovered that this clean step 266 improves the quality of the trench fill layer that will be deposited.

B. Depositing a Trench Fill Layer

Figure 4:
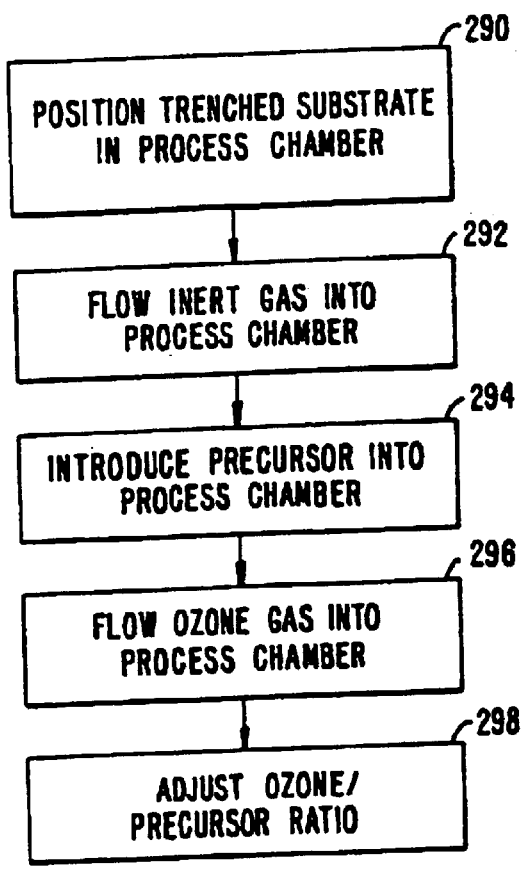
FIG. 4 is a flow diagram of an embodiment of the method of forming a self-planarized trench fill layer formed in accordance with the present invention.

Referring to FIG. 4, after the trenched substrate (224 in FIG. 3a or 270 in FIG. 3b) is prepared, it is placed in a process chamber (such as the chamber 15 of FIG. 8) in step 290. Typically an inert gas is flowed into the chamber in step 292 to stabilize the pressure in the chamber before reactive process gases are introduced. Next, a precursor having a surface sensitivity and growth rate dependence on differently constituted surfaces is introduced into the chamber (step 294). An example of a suitable precursor is TEOS. Because TEOS is a liquid precursor, a suitable apparatus directs the bubbling of a delivery gas, such as helium, through the TEOS in a bubbler assembly or introducing a carrier gas, such as helium or nitrogen, to a liquid injection system to vaporize the TEOS and form a process gas having the desired flow rates. An ozone gas is flowed into the chamber (step 296) to react with the TEOS to deposit an $O_1$/TEOS trench fill layer over the substrate. The deposition rate of the $O_3$/TEOS layer is faster on the lower trench bottom (which is silicon) than on the higher surfaces of the upper portions of the substrate that include the etch stop layer (which is LPCVD nitride or CVD ARC). The relative deposition rates of the $O_3$/TEOS layer on the lower and higher surfaces are regulated in step 298 by adjusting the $O_3$/TEOS ratio until the $O_3$/TEOS layer develops a substantially self-planarized dielectric surface.

The $O_3$/TEOS ratio can be adjusted by adjusting the flow rates of the $O_3$ and/or TEOS. For instance, a predetermined $O_3$/TEOS ratio can be selected and the relative flow rates are adjusted to achieve that ratio in step 298. It is advantageous to maximize the $O_3$/TEOS ratio to accelerate the deposition from the trench bottom to achieve planarity. $O_3$/TEOS ratios of desirably higher than about 10:1, and more desirably about 10:1 to 20:1, can be used.

The deposition of the trench fill layer can take place at a relatively low temperature of under about 500° C. This advantageously avoids the undesirable aluminum fluoride formation which may occur when deposition occurs at high temperatures above about 500° C. (e.g., when necessary to densify the dielectric film for low $O_3$/TEOS ratios) in processing chambers that include aluminum materials and the longer cleaning time required to remove the aluminum fluoride. Other process parameters such as pressure and flow rates can be adjusted to optimize the deposition process for a selected $O_3$/TEOS ratio. A pressure ranging from about 200 to 700 Torr is preferable for use with $O_3$/TEOS ratios of 10:1 to 20:1.

Figure 5A:
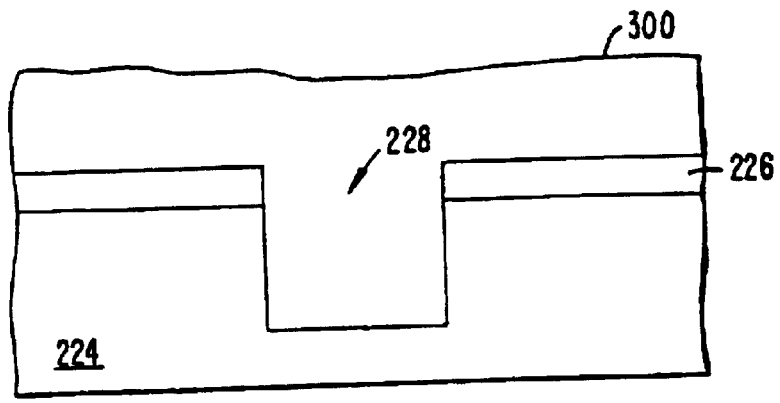
FIGS. 5a and 5b are vertical cross-sectional views of alternate embodiments of a substrate with a self-planarized trench fill layer in accordance with the present invention.
Figure 5B:
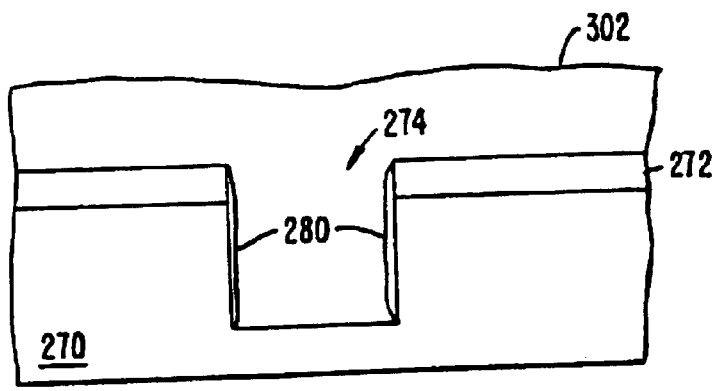

FIGS. 5a and 5b illustrate the self-planarized trench fill dielectric layers 300, 302 respectively deposited over the substrates 224, 270 of FIGS. 3a and 3b prepared respectively using the methods of 8a and 8b. As discussed in more detail below, the present methods not only provide self-planarized deposition of the trench fill layers, but also ensure that these layers are of high quality.

C. Processing the Trench Fill Layer

Figure 6:
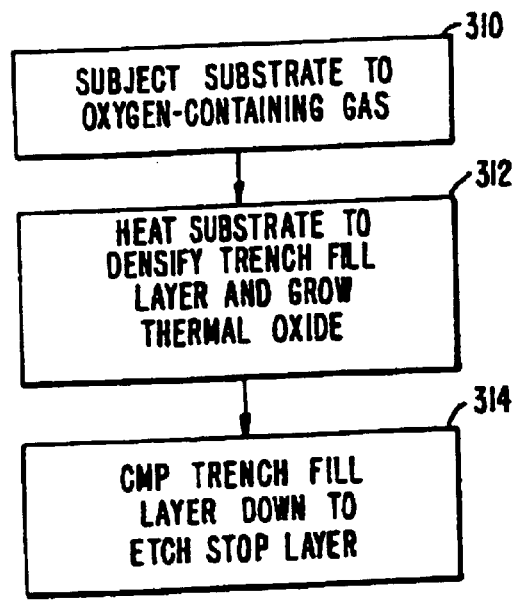
FIG. 6 is a flow diagram of an embodiment of the method of processing a trench fill layer in accordance with the present invention.
Figure 7:
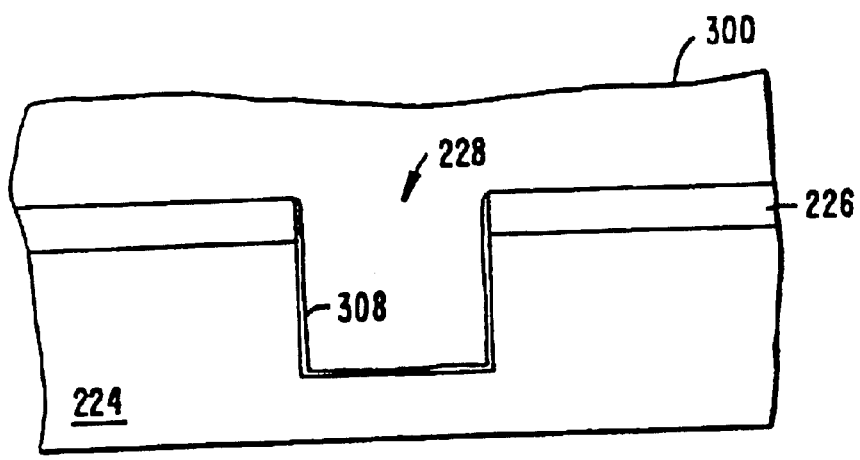
FIG. 7 is a vertical cross-sectional view of the substrate of FIG. 5a which has been processed with an oxidizing anneal in accordance with the present invention.

Referring to FIG. 6, steps 310 and 312 represent an oxidizing anneal process that can be used to grow a thermal oxide at the trench surfaces after the trenches have been filled with the deposited trench fill layer. While the process has general applicability beyond the STI integration described herein, it has particular advantages in this example because the prior thermal oxide growth (FIG. 1d) has been eliminated to ensure formation of a high quality trench fill layer (e.g., $O_3$TEOS) and global planarization in the method of FIG. 2a. This subsequent oxidizing anneal not only causes a thermal oxide to grow at the trench surfaces, but it substantially simultaneously densifies the trench fill layer, further improving its quality. A dense layer is advantageous, particularly for isolation purposes. The oxidizing anneal is performed by subjecting the substrate to an oxygen-containing gas in step 310 (such as molecular oxygen, steam, and any precursor with oxygen); and heating the substrate to a suitable temperature (e.g., above about 800° C.) in step 312. As the substrate 224 of FIG. 5a undergoes the oxidizing anneal, a thermal oxide 308 is grown along the surfaces of the trench 228 as illustrated in FIG. 7. The oxidizing anneal is desirably made after CMP to improve the CMP process, because the surface sensitive deposition is more porous on active areas (LPCVD nitride or CVD ARC) than on the trenches (silicon) as deposited. This difference in film density can be beneficial for the CMP process since the CMP rate will be higher over the active area than over the trenches.

The final step 314 is to selectively remove and planarize the trench fill material, typically by CMP. This step removes the trench fill material over the etch-stop layer which can be LPCVD nitride or CVD ARC. Because the dielectric profile is substantially planar, no reverse mask and etch procedure is necessary and the CMP step can be completed more quickly than the case where the dielectric profile is stepped, such as that shown in FIG. 1f. This further decreases process time and increases througput.

II. An Exemplary CVD System

Figure 8:
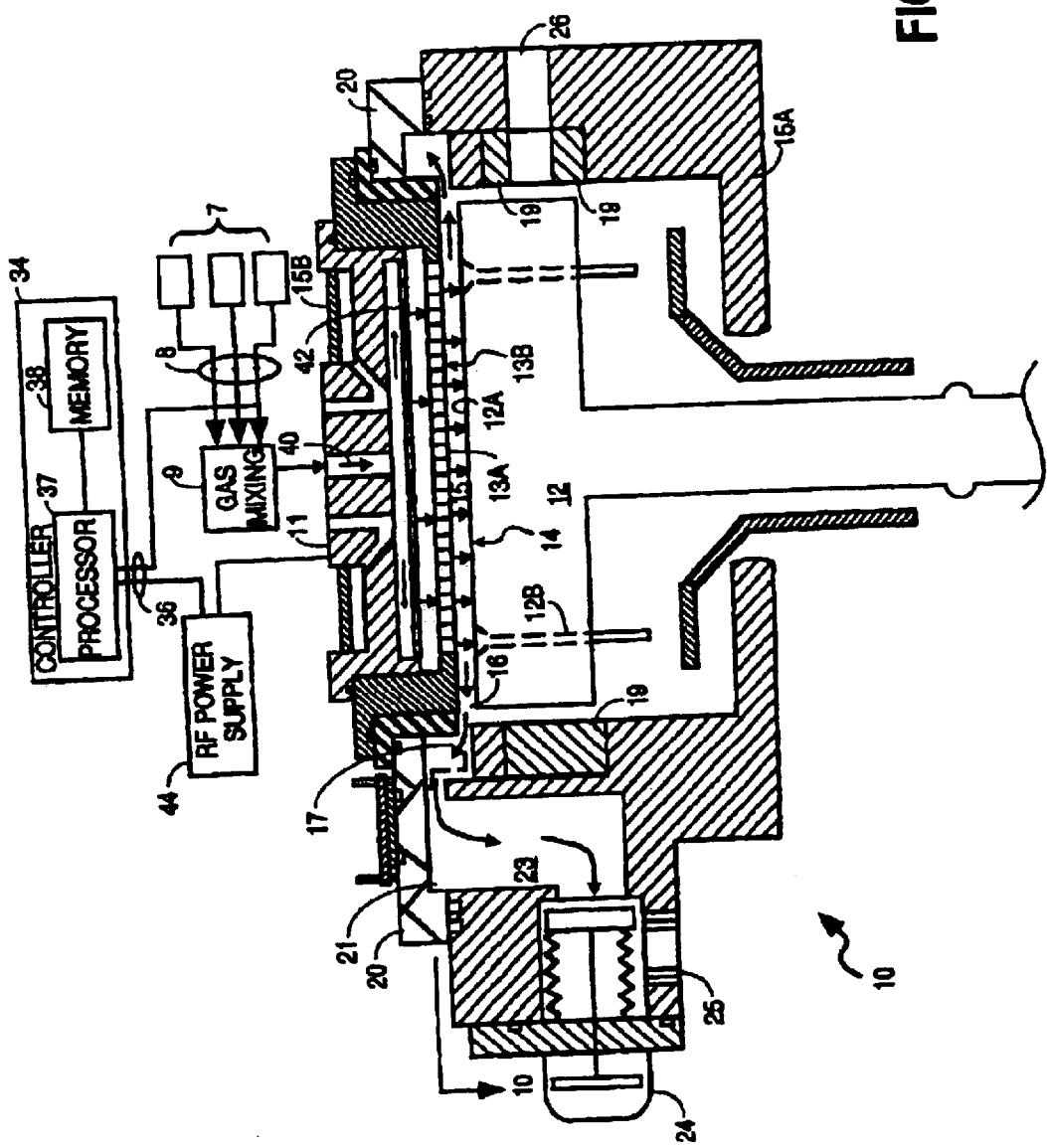
FIG. 8 is a vertical, cross-sectional view of one embodiment of a chemical vapor deposition apparatus according to the present invention.
Figure 9:
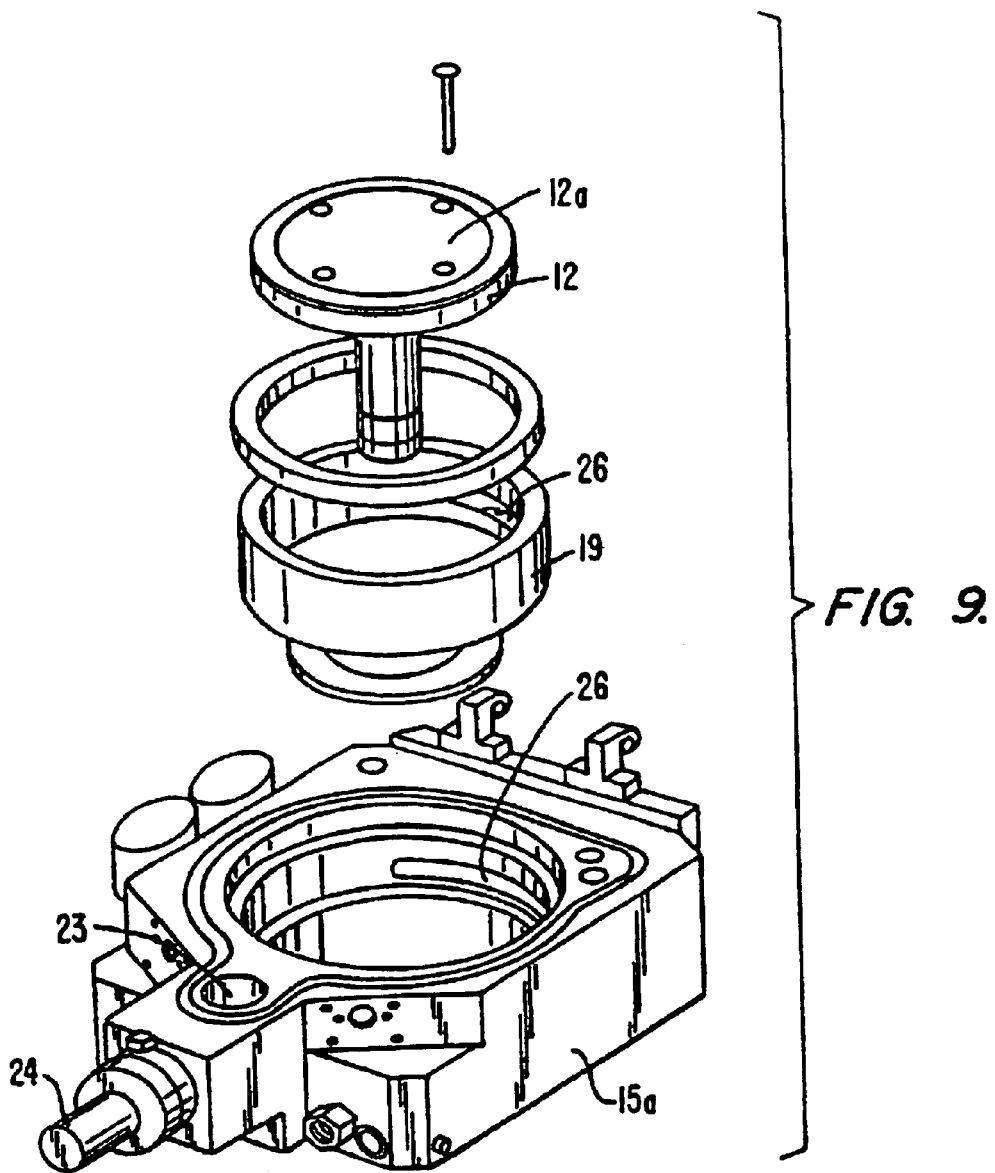
FIGS. 9 and 10 are exploded perspective views of parts of the CVD chamber depicted in FIG. 8.
Figure 10:
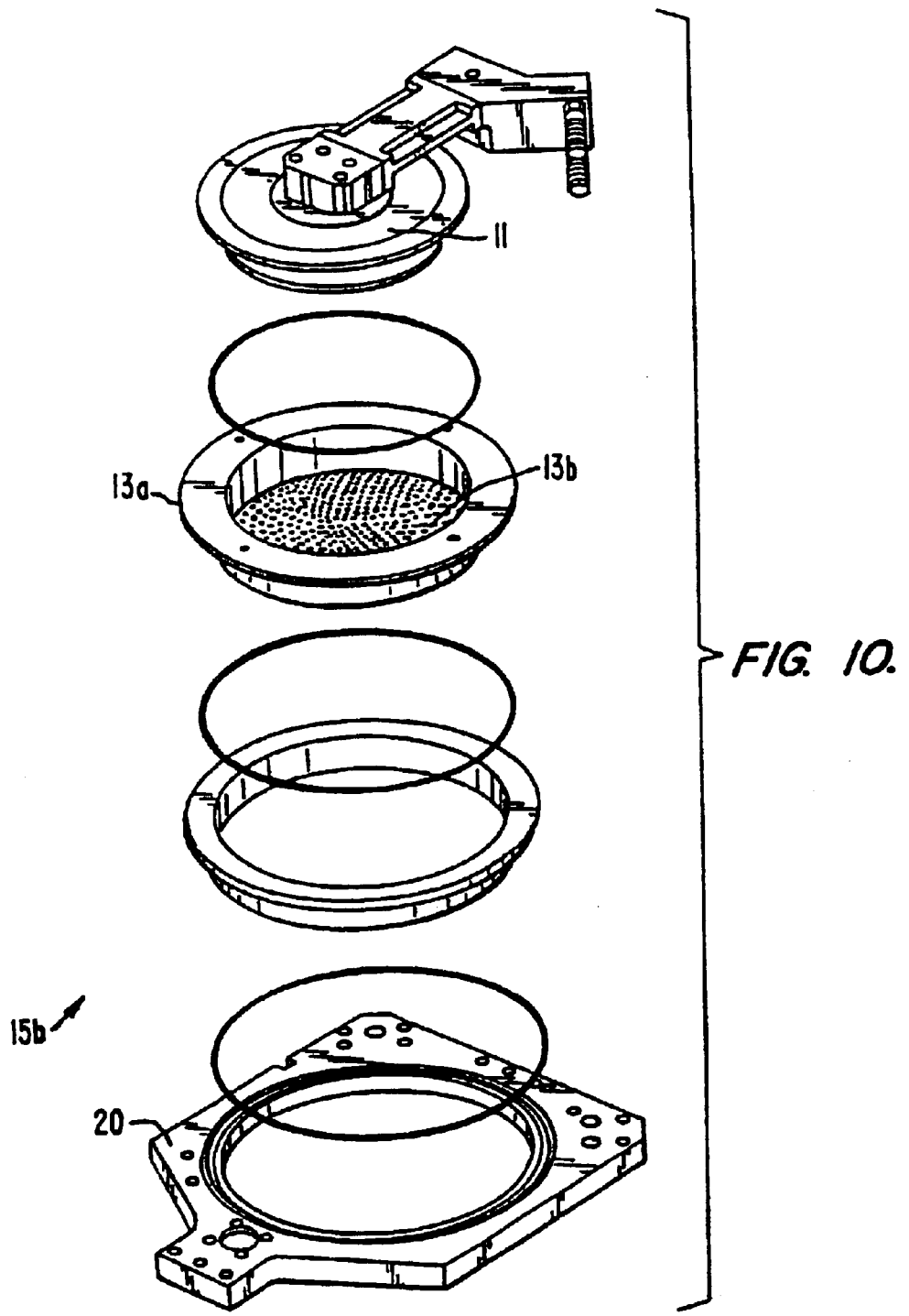

One suitable CVD apparatus in which the method of the present invention can be carried out is shown in FIG. 8, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 9 and 10.

CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (not shown) and an upper processing position (shown in FIG. 8), which is closely adjacent to manifold 11. A centerboard (not shown) includes sensors for providing information on the position of the wafers.

Deposition and carrier gases are introduced into chamber 15 through perforated holes 13b (FIG. 10) of a conventional flat, circular gas distribution or faceplate 13a. More specifically, deposition process gases flow into the chamber through the inlet manifold 11 (indicated by arrow 40 in FIG. 8), through a conventional perforated blocker plate 42 and then through holes 13b in gas distribution faceplate 13a.

Before reaching the manifold, deposition and carrier gases are input from gas sources 7 through gas supply lines 8 (FIG. 8) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heat the entire process chamber 109 including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the beater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No.

5,558,717 patent is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 8) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME stand also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 11:
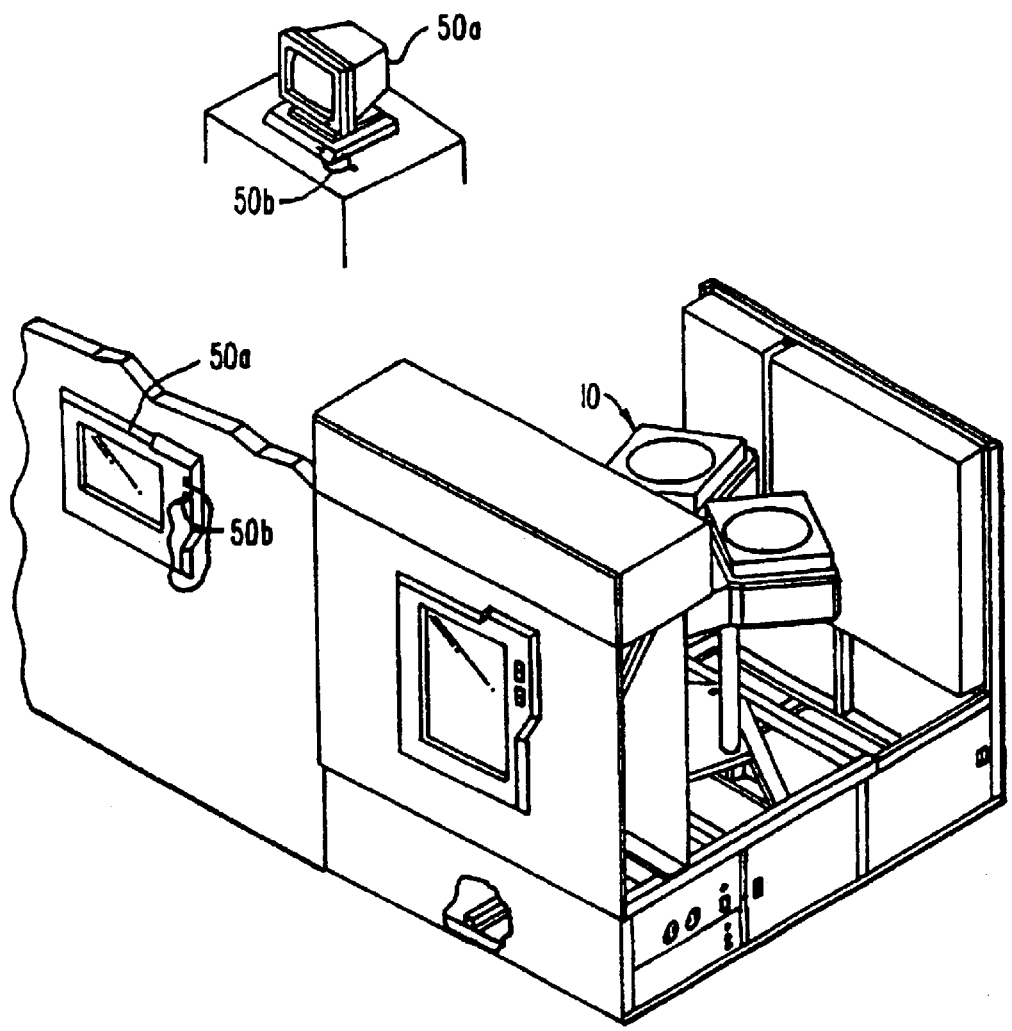
FIG. 11 is a simplified diagram of system monitor and CVD system in a multichamber system, which may include one or more chambers.

The interface between a user and controller 34 is via a CRT monitor 50a and light pen 50b, shown in FIG. 11, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable program language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 12:
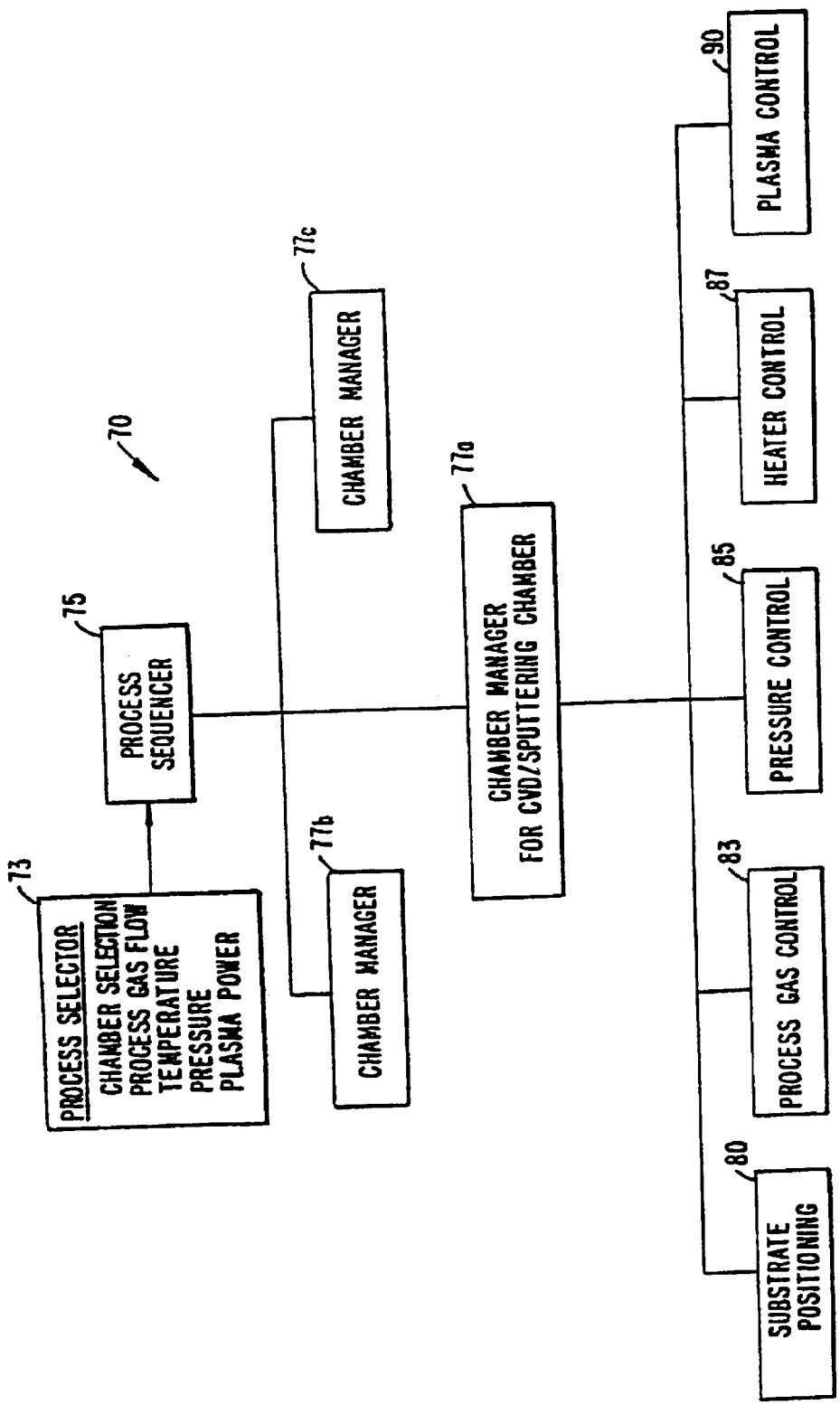
FIG. 12 shows an illustrative block diagram of the hierarchical control structure of the system control software, computer program, according to a specific embodiment.

FIG. 12 is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 12. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. Experiments and Test Results

The following experimental examples are used to illustrate the advantages of the present invention in the dielectric film quality when the different methods described above are used for preparing the trenches in the substrate prior to deposition. The examples were undertaken using a CVD chamber, and in particular, a "DxZ" or a "CxZ" chamber (sized for a 200-mm substrate and having a volume of about 7 liters) fabricated and sold by Applied Materials, Inc., Santa Clara, Calif. Silicon substrates having an LPCVD silicon nitride etch stop layer and trenches with different widths up to 0.25 $\mu$m were used. Deposition was carried out by sub-atmospheric CVD (SACVD). Typical process parameters for the dielectric deposition procedure outlined in FIG. 4 include a pressure of about 200–700 Torr, a heater temperature of about 300–500° C., an inert gas (He or $N_2$) flow rate of about 5,000–10,000 sccm (standard cubic centimeters per minute), an ozone flow rate of about 4,000–8,000 sccm, a TEOS flow rate of about 200–500 mgm (milligram per minute), and an ozone concentration of about 12–20 wt. % (percent by weight).

In the examples shown in FIGS. 13a–16b, the same process parameters were used: a pressure of about 450 Torr, a heater temperature of about 400° C., a helium flow rate of about 3000 sccm, an ozone flow rate of about 5000 sccm, a TEOS flow rate of about 320 mgm, and an ozone concentration of about 12.5 wt. %. This provides an $O_3$/TEOS ratio of about 13:1. The observed deposition rate is about 3000 Å/min on silicon, about 1000 Å/min on LPCVD silicon nitride, and about 1050 Å/min on thermal oxide. The trench depth is about 0.55 $\mu$m and two trench widths are used: 0.25 $\mu$m (FIGS. 13a–16a) and 1 $\mu$m (FIGS. 13b–16b).

Figure 13B:
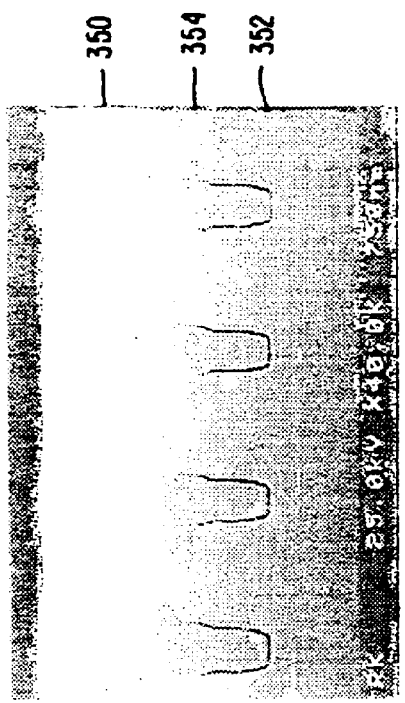
FIGS. 13a and 13b are SEM (scanning electron micrograph) cross-sectional views of a trench fill layer formed using prior art deposition methods.
Figure 13A:
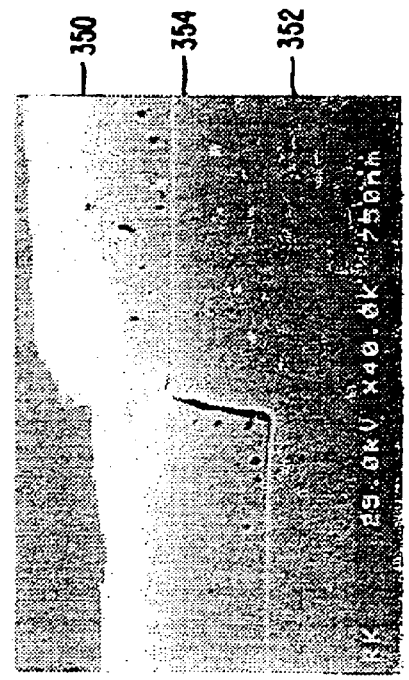

FIGS. 13a and 13b show SEM cross-sectional views of an $O_3$/TEOS layer 350 formed over a trenched substrate 352 with an LPCVD silicon nitride etch stop layer 354. The trenches are prepared using a prior method of growing a thermal oxide at the trench bottoms and trench walls and then etching away the thermal oxide from the trench bottoms. Although the trench fill layer 350 has a surface profile that approaches planarity, defects in the form of separations along the trench surfaces, particularly at the trench walls, are observed. Voids indicating undesirable porosity are observed in the trench fill layer 350 near the trench wall for the trench at the open field (FIG. 13a). These defects are believed to be the result of intrinsic stress differences between dielectric film growth on the silicon at the trench bottom and the thermal oxide at the trench wall. The defects are undesirable, and particularly problematic for isolation purposes.

Figure 14B:
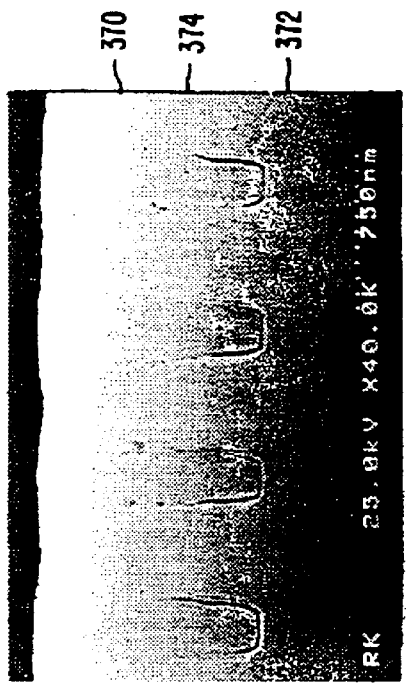
FIGS. 14a and 14b are SEM cross-sectional views of a trench fill layer formed after cleaning an etched trench having thermal oxide on the trench walls.
Figure 14A:
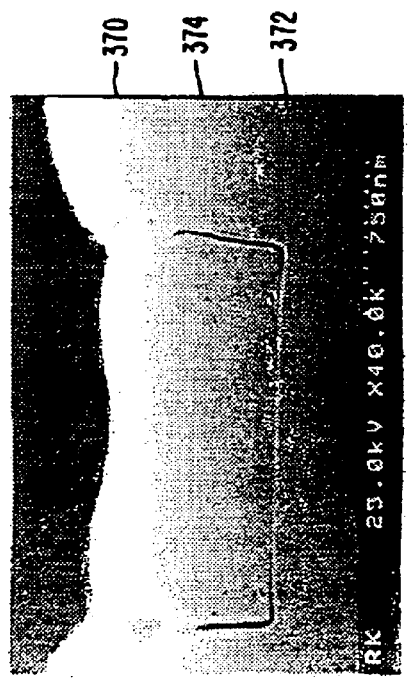

FIGS. 14a and 14b show SEM cross-sectional views of an $O_3$/TEOS layer 370 formed over a trenched substrate 372 using a method of preparing trenches that is similar to that shown in FIG. 2b, except that an LPCVD silicon nitride etch stop layer 374 is used instead of a CVD ARC. According to this method, the trenches are cleaned after etching away the thermal oxide from the trench bottoms (step 266). In this example, a wet etch using a mixture containing about 1% HF is performed for about 10 seconds, although other similar cleaning processes can also be used. As shown in FIGS. 14a and 14b, this clean step quite substantially improves the quality of the dielectric film 370, which has a substantially planar surface. The separations along the trench surface are less pronounced and widespread when compared with those of FIGS. 13a and 13b. The porosity adjacent the trench surfaces is significantly reduced. Cleaning the trenches prior to deposition apparently reduces the stress effects. As seen from the improvement to the quality of the trench fill layer 370, the clean step 266 can offer benefits that outweigh the cost of performing the additional step.

Figure 15B:
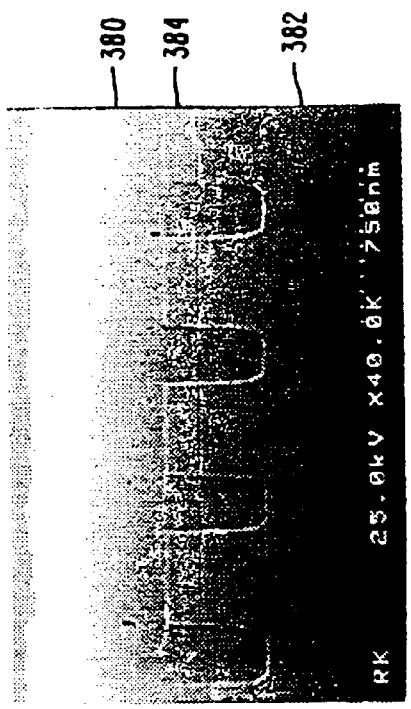
FIGS. 15a and 15b are SEM cross-sectional views of a trench fill layer formed without thermal oxide on the trench surfaces.
Figure 15A:
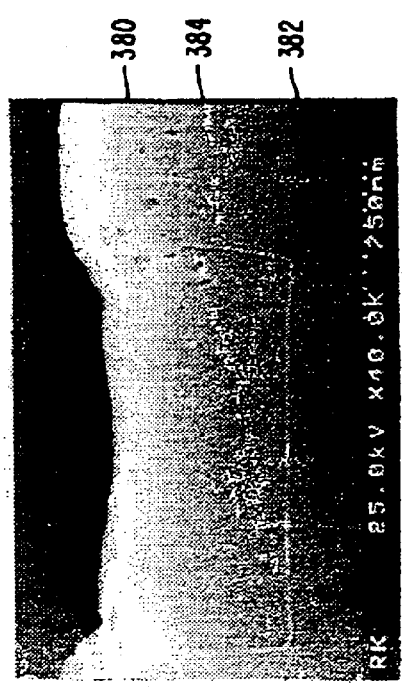

FIGS. 15a and 15b show SEM cross-sectional views of an $O_3$/TEOS layer 380 formed over a trenched substrate 382 using a method of preparing trenches that is similar to that shown in FIG. 2a, except that an LPCVD silicon nitride etch stop layer 384 is used instead of a CVD ARC. This method eliminates the growth of thermal oxide before the deposition of the $O_3$/TEOS film, thereby avoiding stress effects. In this example, however, the clean step 222 is not performed. As shown in FIGS. 15a and 15b, the quality of the substantially planar trench fill layer 380 is remarkably better than those of the first two examples (FIGS. 13a–15b). There is no noticeable separation along the trench surfaces and very few voids are formed, most of which are near or above the LPCVD nitride layer 384 and will subsequently be removed by CMP. The good quality trench fill layer 380 is particularly advantageous for trench isolation purposes. To grow a thermal oxide at the trench surfaces and further densify the trench fill layer 380, the oxidizing anneal procedure described above in connection with FIGS. 6 and 7 can be used.

Figure 16B:
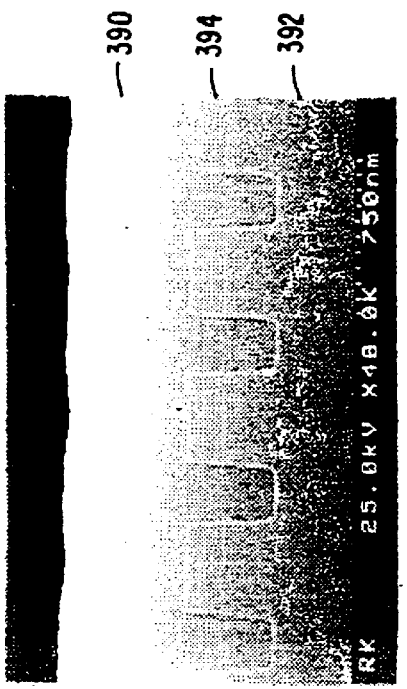
FIGS. 16a and 16b are SEM cross-sectional views of a trench fill layer formed after cleaning a trench having no thermal oxide on the trench surfaces.
Figure 16A:
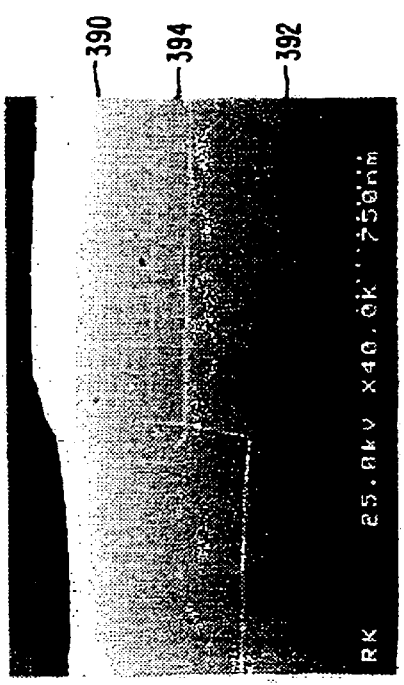

FIGS. 16a and 16b show SEM cross-sectional views of a substantially planar $O_3$/TEOS layer 390 formed over a trenched substrate 392 using a method of preparing trenches that is similar to that shown in FIG. 2a, except that an LPCVD silicon nitride etch stop layer 394 is used instead of a CVD ARC. This method differs from that used to conduct the deposition shown in FIGS. 15a and 15b in that it includes the trench clean step 222 prior to deposition. In this example, the trenches are cleaned by a wet etch using a mixture containing about 1% HF for about 10 seconds. FIGS. 16a and 16b shows some improvement in the quality of the trench fill layer 390 over that of FIGS. 15a and 15b, specifically in terms of less void formation. Thus, the optional clean step 222 can be used when additional improvement in film quality is desired. An oxidizing anneal can also be used to grow a thermal oxide at the trench surfaces. The trench fill layer 390 of FIG. 16a has superior global planarization with virtually no step height effect as compared with the trench fill layer 128 shown in FIG. 1e, which has the step height 130.

As seen from the above discussion, defects are formed along and adjacent to trench surfaces when the dielectric material is deposited over a trench having a thermal oxide grown on the trench wall and trench bottom and then etched from the trench bottom. Some embodiments of the present invention reduce the formation of the defects by applying a trench clean step prior to deposition of the dielectric trench fill material. In a preferred embodiment, the conventional thermal oxide growth is eliminated prior to deposition to substantially eliminate the defects. Instead, a thermal oxide is preferably grown on the trench surfaces after deposition using an oxidizing anneal procedure which also densifies the dielectric trench fill layer.

The present method can be used to improve the global planarization without sacrificing the quality of the dielectric film and to reduce cost and increase throughput. The oxidizing anneal makes it possible to grow a thermal oxide at the trench surfaces after filling the trenches with a self-planarized, high quality trench fill layer. The use of CVD ARC for photolithography and CMP purposes to form trenches is more efficient and results in a simpler structure. In addition, alternate embodiments can be devised by, for example, varying the $O_3$/TEOS ratio, pressure, or other parameters for dielectric deposition. The scope of the invention should, therefore, be determined not with reference to the above description, but instead should be determined with reference to the appended claims along with their full scope of equivalents.

What is claimed is:

1. A method comprising:

providing a silicon substrate in a substrate processing chamber, said silicon substrate having upper portions;

forming a trench in said silicon substrate between said upper portions, said trench having a trench bottom and a trench wall;

introducing a precursor, preferably TEOS, into said substrate processing chamber to form a dielectric layer over said silicon substrate, the precursor providing a deposition rate dependence of said dielectric layer on differently constituted surfaces at different levels on said substrate, said differently constituted surfaces at different levels comprising said trench bottom and a material on said upper portions;

flowing ozone into said substrate processing chamber to react with said precursor to deposit a dielectric layer over said substrate; and adjusting an ozone/precursor ratio between said ozone and said precursor to regulate deposition rates of said dielectric layer on said differently constituted surfaces until said dielectric layer develops a substantially planar dielectric surface.

2. The method of claim 1 further comprising, prior to said introducing, flowing, and adjusting steps, the step of cleaning said trench.

3. The method of claim 2 wherein said cleaning step includes exposing said trench to a wet etchant.

4. The method of claim 1 wherein said material on said upper portions includes a CVD anti-reflective coating on said silicon substrate.

5. The method of claim 1 wherein said trench is formed by applying a CVD anti-reflective coating on and contacting said silicon substrate; forming a photoresist on said CVD anti-reflective coating; exposing a portion of said photoresist to a light to define a location where said trench is to be formed; removing said photoresist at said location; and etching, at said location, through said CVD anti-reflective coating and through a depth of said substrate to form said trench at said location.

6. The method of claim 1 further comprising the steps of flowing an oxygen-containing gas into said substrate processing chamber and heating said substrate to substantially simultaneously densify said dielectric layer and to form a thermal oxide to said trench bottom and trench wall.

7. The method of claim 1 wherein said adjusting step includes generating faster deposition rates on lower surfaces than on higher surfaces of said substrate.

8. The method of claim 1 further comprising the step of generating a pressure of about 200–700 Torr and a temperature of about 300–500° C. in said substrate processing chamber.

9. The method of claim 1 wherein said adjusting step includes adjusting said ozone/precursor ration to about 10:1 to 20:1, preferably about 13:1.

10. The method of claim 9 further comprising the step of controlling a pressure in said substrate processing chamber based on an ozone/precursor ratio selected during said adjusting step.

11. A substrate processing system comprising:

a housing defining a process chamber;

a substrate holder, located within said process chamber, for holding a silicon substrate which includes a silicon trench formed between upper portions and having a trench bottom and a trench wall;

a gas delivery system for introducing process gases into said process chamber;

a controller for controlling said gas delivery system; and a memory coupled to said controller comprising a computer-readable medium having a computer-readable program embodied therein for directing operation of said controller, said computer-readable program including a set of instructions to control said gas delivery system to introduce a process gas including ozone and a precursor into said process chamber to form a dielectric layer on said silicon substrate, said precursor providing deposition rate dependence of said dielectric layer on differently constituted surfaces at different levels comprising said trench bottom and a material on said upper portions of said silicon substrate, and to adjust an ozone/precursor ratio between said ozone and said precursor until said dielectric layer develops a substantially planar dielectric surface.

12. A method for forming a trench isolation structure on a silicon substrate, the method comprising the steps of:

applying a CVD anti-reflective coating on and contacting said silicon substrate;

forming a photoresist on said CVD anti-reflective coating;

exposing a portion of said photoresist to a light to define a location where a trench is to be formed;

removing said photoresist at said location; and etching, at said location, through said CVD anti-reflective coating and through a depth of said silicon substrate to form said trench at said location.

13. The method of claim 12 wherein said CVD anti-reflective coating is applied with a thickness of about 1000–2000 Å.

14. The method of claim 12 further comprising, following said etching step, the steps of:

removing a remainder of said photoresist; and filling said trench on said substrate with a trench fill material, preferably an oxide.

15. The method of claim 14 wherein said oxide comprises an oxide film produced by reacting a precursor, preferably TEOS, and ozone.

16. The method of claim 15 wherein said oxide film has a ratio of said ozone to said precursor of about 10:1 to 20:1, preferably about 13:1.

17. The method of claim 15 further comprising the steps of:

subjecting said substrate to an oxygen-containing gas; and heating said substrate to substantially simultaneously density said trench fill material and to form a thermal oxide at an interface between said trench fill material and a surface of said trench.

18. The method of claim 14 further comprising the steps of:

subjecting said substrate to an oxygen-containing gas; and heating said substrate to substantially simultaneously density said trench material and to form a thermal oxide at an interface between said trench fill material and a surface of said trench.

19. The method of claim 14 wherein said trench filling step includes depositing a layer of said trench fill material in said trench and said CVD anti-reflective coating; and selectively removing said trench fill material over said CVD anti-reflective coating.

20. The method of claim 19 wherein said selective removing step is a chemical mechanical polishing step and wherein said CVD anti-reflective coating acts as an etch stop for said chemical mechanical polishing step.

21. The method of claim 12 wherein said CVD anti-reflective coating is formed by a plasma-enhanced chemical vapor deposition of a dielectric material.

22. The method of claim 21 wherein said dielectric material is selected from the group consisting of silicon nitride and silicon oxynitride.

23. The method of claim 12 wherein said CVD anti-reflective coating comprises silicon carbide.

* * * * *